United States Patent
Ikari et al.

[11] Patent Number: 5,883,555
[45] Date of Patent: Mar. 16, 1999

[54] MAGNETOSTATIC WAVE DEVICE

[75] Inventors: Masanori Ikari; Masayuki Tanno; Toshihiko Ryuo, all of Annaka; Takao Kuki; Toshihiro Nomoto, both of Tokyo, all of Japan

[73] Assignees: Shin-Etsu Chemical Co., Ltd.; Nippon Hoso Kyokai, both of Tokyo, Japan

[21] Appl. No.: 915,680

[22] Filed: Aug. 21, 1997

[30] Foreign Application Priority Data

Aug. 23, 1996 [JP] Japan .................................. 8-222378
Aug. 23, 1996 [JP] Japan .................................. 8-222384

[51] Int. Cl.$^6$ .................................................. H01P 1/215
[52] U.S. Cl. .......................................... 333/202; 333/24.1
[58] Field of Search ................................. 333/24.1, 24.2, 333/201, 202, 204

[56] References Cited

U.S. PATENT DOCUMENTS 4,595,889 6/1986 Stitzer et al. ....................... 333/24.1 X
5,601,935 2/1997 Fujino et al. ....................... 333/201 X

FOREIGN PATENT DOCUMENTS 3-214901 9/1991 Japan .................................. 333/201
7-130539 5/1995 Japan .

OTHER PUBLICATIONS

"A Consideration On MSSW /BVW Hybrid Modes For An S/N Enhancer"by T. Kuki et al; 1996.

"A Signal–To–Noise Enhancer Using Two MSSW Filters And Its Application To Noise Reduction In DBS Reception".

"A Signal–To–Noise Enhancer With Extended Bandwidth Using Two MSSW Filters And And Two 90+ Hybrids", by Y. Ishikawa et al; 1994 Aisa Pacific Microwave Conference.

"A Reflection Type Of MSW Signal–To–Noise Enhancer In The 400–MHz Band" By T. Kuki et al; 1995 IEEE MIT–S Digest.

"Surface Morphologies and Quality of Thick Liquid Phase Epitaxial Garnet Films For Magneto–Optic Devices" by T. Hibiya; Journal of Crystal Growth 62 (1983)87–94; North–Holland Publishing Company.

*Primary Examiner*—Paul Gensler
*Attorney, Agent, or Firm*—Lowe Hauptman Gopstein Gilman & Berner

[57] ABSTRACT

A magnetostatic wave device includes a $Gd_3Ga_5O_{12}$ substrate off-angled from a {110} plane. A magnetic thin film including a crystal of garnet is formed on the $Gd_3Ga_5O_{12}$ substrate by liquid-phase epitaxy. A transducer is operative for exciting magnetostatic wave in the magnetic thin film in response to an RF electric signal. A bias magnetic field is applied to the magnetic thin film. There is a relation as $20° \leq |\theta_1 + \theta_2| \leq 35°$, where "$\theta_1$" denotes an angle between a longitudinal direction of the transducer and a <001> orientation of the crystal in the magnetic thin film, and "$\theta_2$" denotes an angle between a direction of the bias magnetic field and a transverse direction of the transducer which is perpendicular to the longitudinal direction thereof.

4 Claims, 6 Drawing Sheets

FIG. 4

| | $\theta_1$ [°] | $\theta_2$ [°] | $\theta_1+\theta_2$ [°] | CENTER FREQUENCY [MHz] | TEMPERATURE VARIATION RANGE [°C] | FREQUENCY VARIATION WIDTH [MHz] |
|---|---|---|---|---|---|---|
| EXAMPLE 1 | 25 | 0 | 25 | 596 | 0~90 | 12.1 |
| EXAMPLE 2 | 0 | 20 | 20 | 653 | 30~80 | 3.1 |
| EXAMPLE 3 | 0 | 25 | 25 | 736 | 27~80 | 5.1 |
| EXAMPLE 4 | 0 | 30 | 30 | 790 | 31~80 | 8.2 |
| EXAMPLE 5 | 10 | 15 | 25 | 578 | 30~82 | 1.5 |
| EXAMPLE 6 | 15 | 5 | 20 | 617 | 28~81 | 13.3 |
| EXAMPLE 7 | 20 | 10 | 30 | 513 | 30~80 | 13.7 |
| EXAMPLE 8 | 30 | −10 | 20 | 628 | 29~83 | 10.7 |
| EXAMPLE 9 | 30 | 0 | 30 | 641 | 29~97 | 13.5 |
| EXAMPLE 10 | 30 | 5 | 35 | 643 | 27~81 | 2.3 |
| COMPARATIVE EXAMPLE 1 | 0 | 0 | 0 | 655 | 23~81 | 39.6 |
| COMPARATIVE EXAMPLE 2 | 30 | 10 | 40 | 554 | 28~80 | 45.9 |

FIG. 6

| | $\theta_3$ [°] | TEMPERATURE VARIATION RANGE [°C] | FREQUENCY VARIATION WIDTH [MHz] | CENTER FREQUENCY [MHz] |
|---|---|---|---|---|
| | −82 | ...... | ...... | NOT EXCITED |
| | −80 | 29~81 | 6.8 | 611 |
| | −75 | 30~81 | 7.2 | 548 |
| | −65 | 28~82 | 11.3 | 455 |
| | −45 | 29~81 | 8.8 | 479 |
| $\theta_1=20°$ | −20 | 29~80 | 8.3 | 488 |
| $\theta_2=0°$ | 0 | 29~81 | 8.6 | 604 |
| | 20 | 27~81 | 10.1 | 551 |
| | 45 | 29~80 | 9.5 | 503 |
| | 65 | 28~82 | 10.9 | 492 |
| | 75 | 29~80 | 7.6 | 602 |
| | 80 | 30~83 | 8.2 | 741 |
| | 82 | ...... | ...... | NOT EXCITED |

MAGNETOSTATIC WAVE DEVICE

BACKGROUND OF THE INVENTION

1. Field of the Invention

This invention relates to a magnetostatic wave device such as a microwave filter, a resonator, or an S/N (signal-to-noise ratio) enhancer.

2. Description of the Related Art

As an RF signal received by a satellite broadcasting television receiver weakens due to rain, snow (white specks) increases in reproduced pictures on a display of the television receiver. When the received RF signal falls into an unacceptable range, it is difficult to reproduce pictures on the display.

T. Nomoto et al have proposed an S/N enhancer for improving the signal-to-noise ratio of a received RF television signal (T. Nomoto et al., IEEE Trans. on Microwave Theory and Techniques, Vol. 41, No. 8, August 1993, pp. 1316–1322). This prior-art S/N enhancer is of the cancel type, using two magnetostatic surface wave filters.

Y. Ishikawa et al have developed an adaptor for a satellite broadcasting television receiver (Y. Ishikawa et al., Proc. of 1994 Asia Pacific Conference, pp. 179–183). This prior-art adaptor uses an S/N enhancer designed to operate for a 1.9-GHz band. In the prior-art adaptor, a signal in a first IF band of 1 GHz to 1.3 GHz which is derived from a received RF signal is up-converted to a 1.9-GHz signal, and the 1.9-GHz signal is processed by the S/N enhancer. The processing-resultant signal, that is, the filtering-resultant signal, is down-converted back to a signal in the first IF band. The prior-art adaptor includes frequency converters in addition to the S/N enhancer. Thus, the prior-art adaptor tends to be expensive.

An S/N enhancer capable of operating at frequencies of 1 GHz to 1.3 GHz has been desired. Also, an S/N enhancer has been desired which can operate for a 400-MHz band, that is, a second IF band in a satellite broadcasting television receiver.

Japanese published unexamined patent application 7-130539 discloses a magnetostatic surface wave device. This prior-art magnetostatic surface wave device includes a film of single crystal of garnet which is grown on a $Gd_3Ga_5O_{12}$ substrate. The $Gd_3Ga_5O_{12}$ substrate has a plane orientation being one from among (110), (100), and (211). In the prior-art magnetostatic surface wave device, an anisotropic magnetic field can be weak so that the lower limit of the frequency band for the propagation of magnetostatic surface wave can be a relatively low frequency. In Japanese application 7-130539, the lowest frequency of magnetostatic surface wave is 900 MHz when a saturation magnetization is 1,760 G and the plane orientation of the substrate is (100). Accordingly, it is difficult to use the prior-art magnetostatic surface wave device as an S/N enhancer operating for a 400-MHz band.

T. Kuki et al have developed a reflection-type S/N enhancer operating for a 400-MHz band (T. Kuki et al., 1995 IEEE MTT-S Digest, pp. 111–114). To attain an operating frequency of 400 MHz, this prior-art reflection-type S/N enhancer uses a thin film of YIG which has a relatively low saturation magnetization. Since this prior-art S/N enhance is of the reflection type, the width of an operating frequency band thereof is a small value equal to 40 MHz. The operating frequency of this prior-art reflection-type S/N enhancer tends to considerably depend on an ambient temperature. Accordingly, it is difficult to practically use this prior-art reflection-type S/N enhancer.

T. Kuki et al used a magnetostatic wave in a reflection-type S/N enhancer designed as a mixture of surface wave and backward volume wave (T. Kuki et al., Manuscript C-106, General Meeting 1996, Japanese Institute of Electronics, Information and Communication Engineers). This prior-art design is effective in lowering and widening the operating frequency band of the reflection-type S/N enhancer although a saturation magnetization is relatively great. The temperature characteristic of the reflection-type S/N enhancer of the prior-art design has not been investigated. To operate the reflection-type S/N enhancer of the prior-art design, it is necessary to further lower the operating frequency thereof.

SUMMARY OF THE INVENTION

It is an object of this invention to provide a magnetostatic wave device having a good temperature characteristic.

It is another object of this invention to provide a magnetostatic wave device capable of operating at a further lowered frequency in comparison with the prior-art operating frequency.

A first aspect of this invention provides a magnetostatic wave device comprising a $Gd_3Ga_5O_{12}$ substrate off-angled from a {110} plane; a magnetic thin film including a crystal of garnet and being formed on the $Gd_3Ga_5O_{12}$ substrate by liquid-phase epitaxy; a transducer for exciting magnetostatic wave in the magnetic thin film in response to an RF electric signal; and means for applying a bias magnetic field to the magnetic thin film; wherein there is a relation as $20° \leq |\theta_1 + \theta_2| \leq 35°$, where "$\theta_1$" denotes an angle between a longitudinal direction of the transducer and a <001> orientation of the crystal in the magnetic thin film, and "$\theta_2$" denotes an angle between a direction of the bias magnetic field and a transverse direction of the transducer which is perpendicular to the longitudinal direction thereof.

A second aspect of this invention is based on the first aspect thereof, and provides a magnetostatic wave device wherein the $Gd_3Ga_5O_{12}$ substrate is off-angled from the {110} plane by an angle in a range of 1° to 5°.

A third aspect of this invention provides a magnetostatic wave device comprising a $Gd_3Ga_5O_{12}$ substrate off-angled from a {110} plane; a magnetic thin film including a crystal of garnet and being formed on the $Gd_3Ga_5O_{12}$ substrate by liquid-phase epitaxy; a transducer for exciting magnetostatic wave in the magnetic thin film in response to an RF electric signal, the transducer including a strip line; and means for applying a bias magnetic field to the magnetic thin film; wherein there is a relation as $20° \leq |\theta_1 + \theta_2| \leq 35°$, where "$\theta_1$" denotes an angle between a longitudinal direction of the transducer and a <001> orientation of the crystal in the magnetic thin film, and "$\theta_2$" denotes an angle between a direction of the bias magnetic field and a transverse direction of the transducer which is perpendicular to the longitudinal direction thereof; and wherein there is a relation as $|\theta_3| \leq 75°$, where "$\theta_3$" denotes an angle between a horizontal plane of the magnetic thin film and the direction of the bias magnetic field which occurs under conditions where the magnetic thin film and the transducer have been inclined and rotated about a rotation axis being the strip line of the transducer.

A fourth aspect of this invention is based on the third aspect thereof, and provides a magnetostatic wave device wherein the $Gd_3Ga_5O_{12}$ substrate is off-angled from the {110} plane by an angle in a range of 1° to 5°.

BRIEF DESCRIPTION OF THE DRAWINGS

FIG. 4 is a diagram of various parameters of magnetostatic wave devices in examples of this invention and comparative examples.

FIG. 6 is la diagram of the relation among a specified angle, a temperature variation range, a center frequency of a reflection loss, and a center frequency variation width regarding a sample of the magnetostatic wave device in FIG. 5.

DESCRIPTION OF THE FIRST PREFERRED EMBODIMENT

Figure 1:
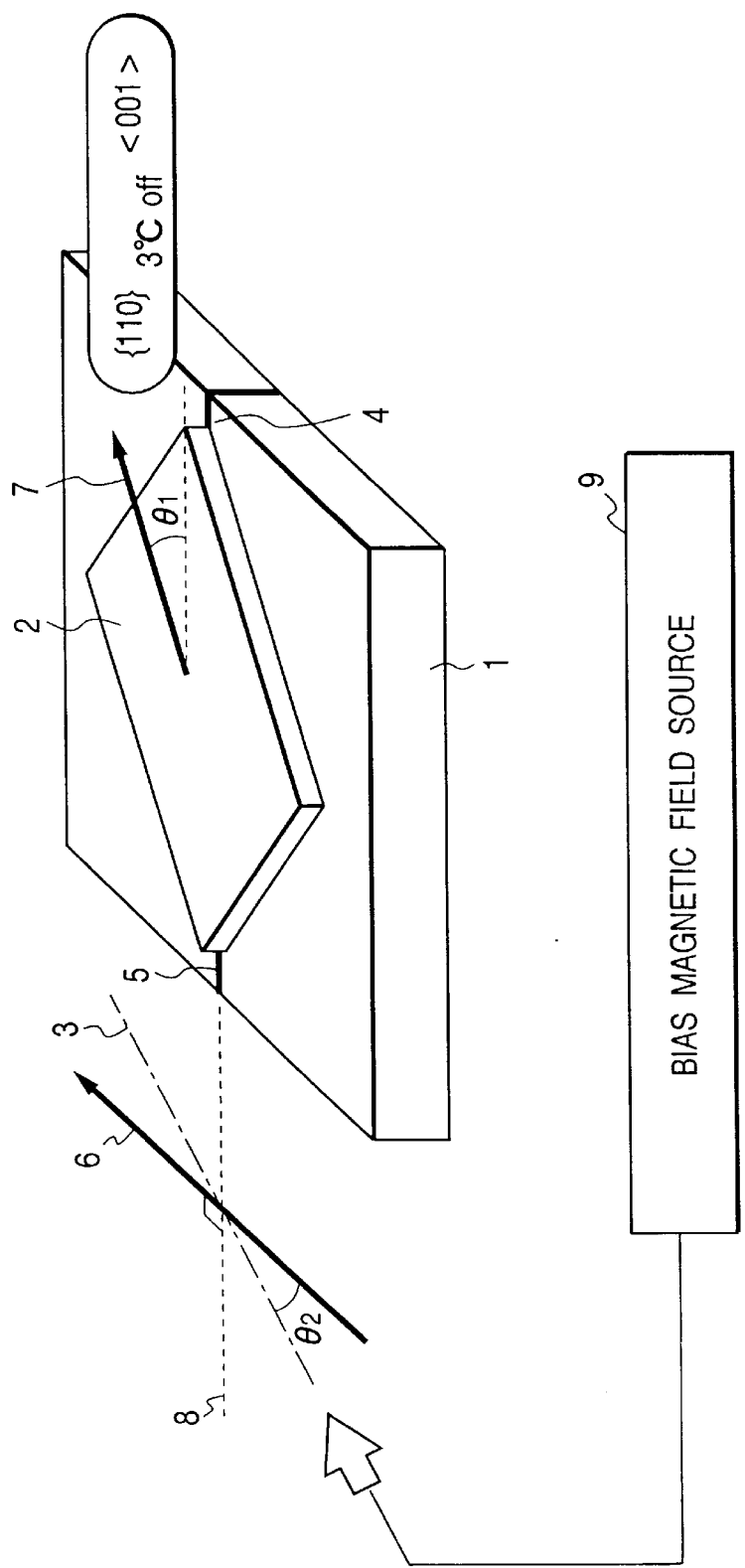
FIG. 1 is a diagram including a perspective view of a functional portion of a magnetostatic wave device according to a first embodiment of this invention.

With reference to FIG. 1, a magnetostatic wave device (for example, a microwave filter or a reflection-type S/N enhancer) includes a dielectric substrate 1 on which a magnetic thin film 2 of crystal (cubic crystal) of garnet is formed by, for example, liquid-phase epitaxy. A lower surface or a bottom surface of the dielectric substrate 1 is formed with a ground plane. The magnetic thin film 2 serves as a magnetostatic wave element. The magnetic thin film 2 is off-angled from or misoriented with respect to the {110} plane of the dielectric substrate 1 by a value in the range of 1° to 5°.

In FIG. 1, the numeral 3 denotes the direction of a bias magnetic field applied by a suitable device 9 referred to as a bias magnetic field source.

A transducer 4 provided on the dielectric substrate 1 connects with the magnetic thin film 2. The transducer 4 is used in exciting a magnetostatic wave in response to an RF electric signal (RF electromagnetic wave). The transducer 4 is designed to provide acceptable impedance matching between an electromagnetic wave and magnetostatic wave. An input/output port 5 provided on the dielectric substrate 1 connects with the transducer 4.

In FIG. 1, the numeral 6 denotes a transverse direction of the transducer 4 which agrees with a direction of the propagation of magnetostatic wave. The transverse direction 6 is in a horizontal plane, and is perpendicular to the longitudinal direction 8 of the transducer 4. Here, the horizontal plane is defined as a plane parallel to an upper surface (a major or main surface) of the magnetic thin film 2 or the dielectric substrate 1. In addition, the numeral 7 denotes the <001> orientation of the crystal in the magnetic thin film 2. Furthermore, the character $\theta_1$ denotes the angle between the longitudinal direction 8 of the transducer 4 and the <001> orientation 7 of the magnetic thin film 2, and the character $\theta_2$ denotes the angle between the direction 3 of the bias magnetic field and the transverse direction 6 of the transducer 4 in a horizontal plane.

Positive values of the angles $\theta_1$ and $\theta_2$ are defined as being along clockwise directions while negative values of the angles $\theta_1$ and $\theta_2$ are defined as being along counterclockwise directions.

The mode of the propagation of excited magnetostatic wave in the magnetostatic wave element (the magnetic thin film 2) of the magnetostatic wave device is one among a mode using only magnetostatic surface wave (MSSW), a mode using only magnetostatic backward volume wave (MSBVW), and a mode using a mixture of magnetostatic surface wave (MSSW) and magnetostatic backward volume wave (MSBVW).

The frequency "f" (MHz) of magnetostatic wave excited in the mode related to magnetostatic backward volume wave (MSBVW) is approximately given by the following equation.

$$f=\gamma\{(H+Ha)\cdot(H+Ha+4\pi Ms)\}^{1/2} \qquad (1)$$

where "H" denotes the bias magnetic field; "Ha" denotes the anisotropic magnetic field caused by a 1-order anisotropy constant of the cubic crystal; "$4\pi Ms$" denotes the saturation magnetization of the magnetic thin film 2; and "$\gamma$" denotes a rotational magnetism ratio (2.8 MHz/Oe).

The saturation magnetization "$4\pi Ms$" of the magnetic thin film 2 and the anisotropic magnetic field Ha depend on an ambient temperature. Accordingly, the frequency "f" of excited magnetostatic wave depends on an ambient temperature in the case where a constant magnetic field is applied as the bias magnetic field H.

The anisotropic magnetic field Ha varies as a function of the crystal orientation, the saturation magnetization "$4\pi Ms$", and the 1-order anisotropy constant $K_1$. The anisotropic magnetic field Ha is expressed as follows.

$$Ha=\{2-(5/2)\cdot\sin^2\theta-(15/8)\cdot\sin^2(2\theta)\}K_1/4\pi Ms \qquad (2)$$

where "$\theta$" denotes the angle between the <001> orientation and the direction of the bias magnetic field or an RF magnetic field in the {110} plane of the dielectric substrate 1. According to the equation (2), the anisotropic magnetic field Ha is nullified when the angle "$\theta$" is equal to about ±30°. The sign of the anisotropic magnetic field Ha is inverted when the angle "$\theta$" moves across one of the points equal to about ±30°. When the bias magnetic field "H" is equal to or weaker than several tens of gauss, temperature dependencies of first and second parenthesized terms in the square root in the equation (1) can be canceled by each other. Thus, in this case, the frequency "f" of excited magnetostatic wave can be constant and independent of a temperature variation.

Accordingly, the frequency "f" of excited magnetostatic wave can be stabilized against an ambient temperature variation by optimizing the direction of the bias magnetic field or the RF magnetic field in the case where the excited magnetic wave is in the mode being one among the mode using only magnetostatic surface wave (MSSW), the mode using only magnetostatic backward volume wave (MSBVW), and the mode using a mixture of magnetostatic surface wave (MSSW) and magnetostatic backward volume wave (MSBVW).

To determine conditions for stabilizing the frequency "f" against an ambient temperature variation by optimizing the direction of the bias magnetic field or the RF magnetic field, the relation between the frequency "f" and the ambient temperature variation was investigated at different values of the angles $\theta_1$ and $\theta_2$. As previously explained, the angle $\theta_1$ agrees with the angle between the longitudinal direction 8 of the transducer 4 and the <001> orientation 7 of the magnetic thin film 2, and the angle $\theta_2$ agrees with the angle between the direction 3 of the bias magnetic field and the transverse direction 6 of the transducer 4 in a horizontal plane. The transverse direction 6 of the transducer 4 is perpendicular to the longitudinal direction 8 thereof.

It was found from the result of the investigation that the width of the variation in the center frequency of a reflection loss of the magnetostatic wave device (which corresponds to the width of the variation in the frequency "f") in response to the ambient temperature variation agreed with a remarkably small value or an acceptable value equal to lower than 15 MHz when the sum of the angles $\theta_1$ and $\theta_2$ was in the range of 20° to 35°. The garnet crystal in the magnetic thin film 2 was cubic, and was hence symmetrical with respect to the <001> orientation 7. Accordingly, it was also found that the width of the variation in the center frequency of a reflection loss of the magnetostatic wave device in response to the ambient temperature variation was remarkably small and was hence acceptable when the sum of the angles $\theta_1$ and $\theta_2$ was in the range of −20° to −35°. On the other hand, the width of the variation in the center frequency of a reflection loss of the magnetostatic wave device in response to the ambient temperature variation was unacceptable when the sum of the angles $\theta_1$ and $\theta_2$ was outside the range of 20° to 35° or the range of −20° to −35°.

To attain a good temperature characteristic of the magnetostatic wave device, it is preferable that the sum of the angles $\theta_1$ and $\theta_2$ is in the range of 20° to 35° or the range of −20° to −35°.

T. Hibiya has reported that during liquid-phase epitaxy on a {110} garnet substrate, crystal tends to abnormally grow, and that a thick film of the crystal is hardly available in this case (T. Hibiya, J. Crystal Growth, 62, p. 87 (1983)). Also, T. Hibiya has reported that use of an off-angled substrate slightly inclined with respect to the {110} plane enables the formation of a thick film.

Experiments were carried out as follows. During the experiments, magnetic thin films of crystal were grown on {110} off-angled or misoriented substrates by liquid-phase epitaxy. Transducers for exciting magnetostatic wave were provided on the {110} off-angled substrates. Thereby, various samples of a magnetostatic wave device were fabricated. There were various relations between the crystal orientations and the transducer orientations. Regarding each of the samples, a measurement was made as to a variation of the frequency of excited magnetostatic wave in response to an ambient temperature variation under conditions where a constant bias magnetic field was applied and the excited magnetostatic wave was in one among the mode using only magnetostatic surface wave (MSSW), the mode using only magnetostatic backward volume wave (MSBVW), and the mode using a mixture of magnetostatic surface wave (MSSW) and magnetostatic backward volume wave (MSBVW). Thus, a variation of the frequency of excited magnetostatic wave in response to an ambient temperature variation was measured while the relation between the crystal orientation and the transducer orientation was changed among various types. It was found from the results of the measurements that the excitation frequency of magnetostatic wave was substantially unchanged in response to an ambient temperature variation in the case of a specified relation between the crystal orientation and the transducer orientation.

It is preferable that the magnetic thin film 2 of garnet, that is, the magnetostatic wave element, is formed by liquid-phase epitaxy on a $Gd_3Ga_5O_{12}$ substrate which is off-angled from or misoriented with respect to the {110} plane by a value in the range of 1° to 5°. When the off-angle is smaller than 1°, crystal tends to abnormally grow so that a thick film of the crystal is hardly available. When the off-angle exceeds 5°, the FMR (ferromagnetic resonance) linewidth ΔH of the magnetic thin film 2 tends to be unacceptably great.

EXAMPLE 1

A sample of the magnetostatic wave device (for example, the microwave filter or the reflection-type S/N enhancer) was fabricated as follows. A $Gd_3Ga_5O_{12}$ substrate was prepared which was off-angled from the {110} plane by 3°. A magnetic thin film of YIG crystal having composition "$La_{0.12}Y_{2.88}Fe_{4.46}Ga_{0.54}O_{12}$" was grown on the $Gd_3Ga_5O_{12}$ substrate by liquid-phase epitaxy. The magnetic thin film had a thickness of 59 $\mu$m. The magnetic thin film exhibited a saturation magnetization "$4\pi Ms$" of 920 G at a room temperature. Regarding the magnetic thin film, the half-value width (the FMR linewidth) ΔH was equal to 1.3 Oe.

The magnetic thin film was cut and shaped into a rectangular chip in a manner such that the longitudinal direction of the chip was parallel to the <001> orientation of the crystal. The chip had a size of 12 mm by 8 mm. A sample of the magnetostatic wave device was completed which used the magnetic thin film chip. The sample of the magnetostatic wave device had the structure of FIG. 1.

In the sample of the magnetostatic wave device, the angle $\theta_1$ between the longitudinal direction of the transducer and the <001> orientation of the crystal in the magnetic thin film was equal to 25°. The angle $\theta_2$ between the direction of the bias magnetic field and the transverse direction of the transducer in a horizontal plane was equal to 0°. The transverse direction of the transducer was perpendicular to the longitudinal direction thereof.

The sample of the magnetostatic wave device causes a reflection loss when magnetostatic wave was excited in the magnetic thin film. Regarding the sample of the magnetostatic wave device, measurements were made as to variations in the center frequency of the reflection loss while a magnetic field having a strength of 40 G was applied as a bias magnetic field and an ambient temperature was changed from 0° to 90°. The results of the measurements are shown in FIG. 2.

Figure 2:
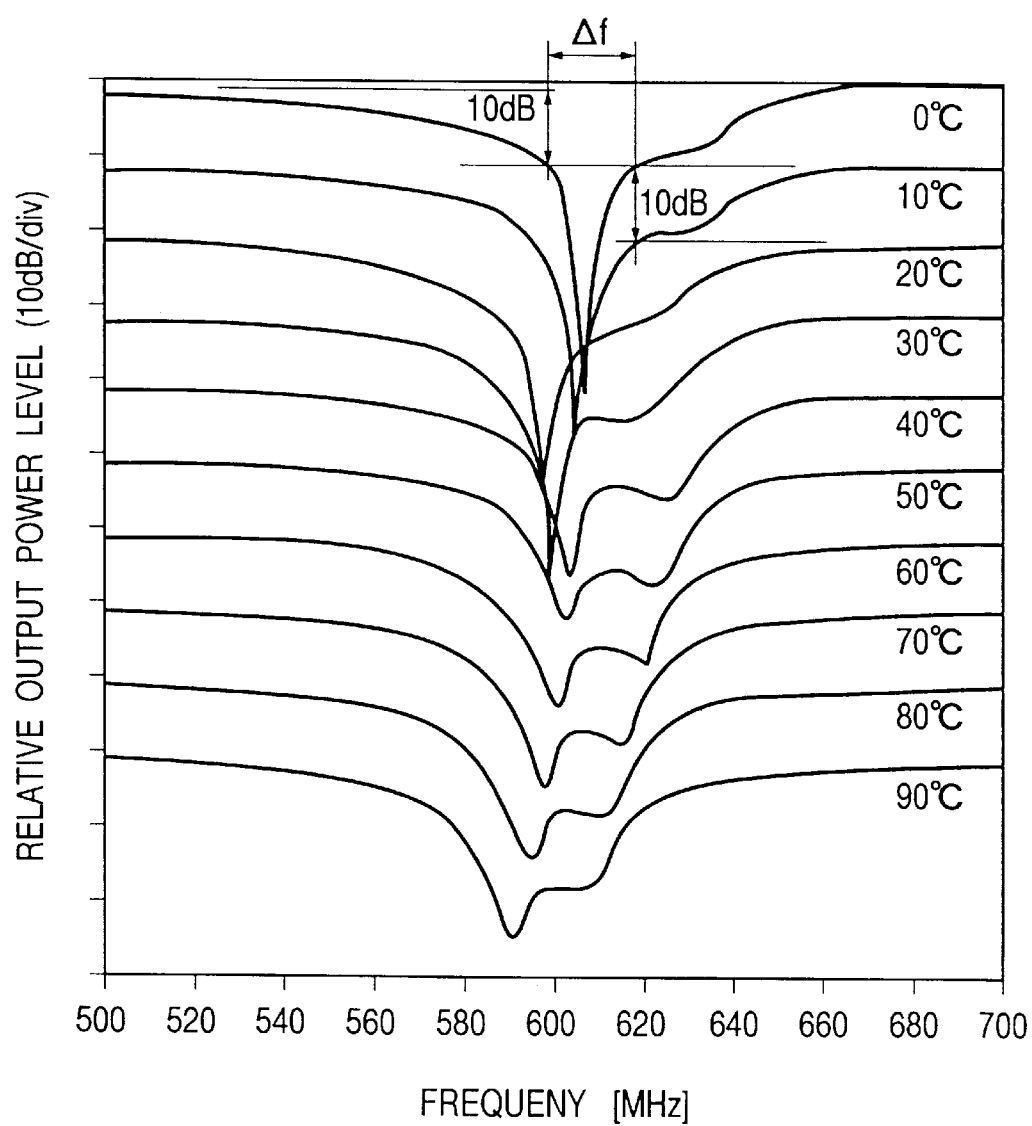
FIG. 2 is a diagram of the relation among the relative level of an output power (which corresponds to a reflection loss), the frequency of the output power, and an ambient temperature regarding a sample of the magnetostatic wave device in FIG. 1.

As shown in FIG. 2, the center frequency of the reflection loss provided by the sample of the magnetostatic wave device was equal to 596 MHz at a room temperature. When the temperature was changed from 0° to 90°, the width of the variation in the center frequency of the reflection loss was equal to 12.1 MHz. The width "Δf" of a band, in which an enhancement amount of at least 10 dB was available, was equal to 22 MHz. These parameters indicated that the sample of the magnetostatic wave device had a good temperature characteristic, and could be used as an effective microwave filter or an effective S/N enhancer.

EXAMPLE 2

A sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 0°, and that the angle $\theta_2$ between the direction of the bias magnetic field and the transverse direction of the transducer in a horizontal plane was equal to 20°. The transverse direction of the transducer was perpendicular to the longitudinal direction thereof.

Parameters of the sample of the magnetostatic wave device were measured as in Example 1. The center frequency of the reflection loss provided by the sample of the magnetostatic wave device was equal to 653 MHz at a room temperature. When the temperature was changed from 30° to 80°, the width of the variation in the center frequency of the reflection loss was equal to 3.1 MHz. These parameters indicated that the sample of the magnetostatic wave device had a good temperature characteristic.

EXAMPLE 3

A sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 0°, and that the angle $\theta_2$ between the direction of the bias magnetic field and the transverse direction of the transducer in a horizontal plane was equal to 25°. The transverse direction of the transducer was perpendicular to the longitudinal direction thereof.

Parameters of the sample of the magnetostatic wave device were measured as in Example 1. The center frequency of the reflection loss provided by the sample of the magnetostatic wave device was equal to 736 MHz at a room temperature. When the temperature was changed from 27° to 80°, the width of the variation in the center frequency of the reflection loss was equal to 5.1 MHz. These parameters indicated that the sample of the magnetostatic wave device had a good temperature characteristic.

EXAMPLE 4

A sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 0°, and that the angle $\theta_2$ between the direction of the bias magnetic field and the transverse direction of the transducer in a horizontal plane was equal to 30°. The transverse direction of the transducer was perpendicular to the longitudinal direction thereof.

Parameters of the sample of the magnetostatic wave device were measured as in Example 1. The center frequency of the reflection loss provided by the sample of the magnetostatic wave device was equal to 790 MHz at a room temperature. When the temperature was changed from 31° to 80°, the width of the variation in the center frequency of the reflection loss was equal to 8.2 MHz. These parameters indicated that the sample of the magnetostatic wave device had a good temperature characteristic.

EXAMPLE 5

A sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 10°, and that the angle $\theta_2$ between the direction of the bias magnetic field and the transverse direction of the transducer in a horizontal plane was equal to 15°. The transverse direction of the transducer was perpendicular to the longitudinal direction thereof.

Parameters of the sample of the magnetostatic wave device were measured as in Example 1. The center frequency of the reflection loss provided by the sample of the magnetostatic wave device was equal to 578 MHz at a room temperature. When the temperature was changed from 30° to 82°, the width of the variation in the center frequency of the reflection loss was equal to 1.5 MHz. These parameters indicated that the sample of the magnetostatic wave device had a good temperature characteristic.

EXAMPLE 6

A sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 15°, and that the angle $\theta_2$ between the direction of the bias magnetic field and the transverse direction of the transducer in a horizontal plane was equal to 5°. The transverse direction of the transducer was perpendicular to the longitudinal direction thereof.

Parameters of the sample of the magnetostatic wave device were measured as in Example 1. The center frequency of the reflection loss provided by the sample of the magnetostatic wave device was equal to 617 MHz at a room temperature. When the temperature was changed from 28° to 81°, the width of the variation in the center frequency of the reflection loss was equal to 13.3 MHz. These parameters indicated that the sample of the magnetostatic wave device had a good temperature characteristic.

EXAMPLE 7

A sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 20°, and that the angle $\theta_2$ between the direction of the bias magnetic field and the transverse direction of the transducer in a horizontal plane was equal to 10°. The transverse direction of the transducer was perpendicular to the longitudinal direction thereof.

Parameters of the sample of the magnetostatic wave device were measured as in Example 1. The center frequency of the reflection loss provided by the sample of the magnetostatic wave device was equal to 513 MHz at a room temperature. When the temperature was changed from 30° to 80°, the width of the variation in the center frequency of the reflection loss was equal to 13.7 MHz. These parameters indicated that the sample of the magnetostatic wave device had a good temperature characteristic.

EXAMPLE 8

A sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 30°, and that the angle $\theta_2$ between the direction of the bias magnetic field and the transverse direction of the transducer in a horizontal plane was equal to −10°. The transverse direction of the transducer was perpendicular to the longitudinal direction thereof.

Parameters of the sample of the magnetostatic wave device were measured as in Example 1. The center frequency of the reflection loss provided by the sample of the magnetostatic wave device was equal to 628 MHz at a room temperature. When the temperature was changed from 29° to 83°, the width of the variation in the center frequency of the reflection loss was equal to 10.7 MHz. These parameters indicated that the sample of the magnetostatic wave device had a good temperature characteristic.

EXAMPLE 9

A sample of the magnetostatic wave device (for example, the microwave filter or the reflection-type S/N enhancer)

was fabricated which was similar to that in Example 1 except that the angle $\theta_1$ between the longitudinal direction of the transducer and the <001> orientation of the crystal in the magnetic thin film was equal to 30°, and that the angle $\theta_2$ between the direction of the bias magnetic field and the transverse direction of the transducer in a horizontal plane was equal to 0°. The transverse direction of the transducer was perpendicular to the longitudinal direction thereof.

Parameters of the sample of the magnetostatic wave device were measured as in Example 1. The center frequency of the reflection loss provided by the sample of the magnetostatic wave device was equal to 641 MHz at a room temperature. When the temperature was changed from 29° to 97°, the width of the variation in the center frequency of the reflection loss was equal to 13.5 MHz. These parameters indicated that the sample of the magnetostatic wave device had a good temperature characteristic.

EXAMPLE 10

A sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 30°, and that the angle $\theta_2$ between the direction of the bias magnetic field and the transverse direction of the transducer in a horizontal plane was equal to 5°. The transverse direction of the transducer was perpendicular to the longitudinal direction thereof.

Parameters of the sample of the magnetostatic wave device were measured as in Example 1. The center frequency of the reflection loss provided by the sample of the magnetostatic wave device was equal to 643 MHz at a room temperature. When the temperature was changed from 27° to 81°, the width of the variation in the center frequency of the reflection loss was equal to 2.3 MHz. These parameters indicated that the sample of the magnetostatic wave device had a good temperature characteristic.

Comparative Example 1

A comparative sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 0°, and that the angle $\theta_2$ between the direction of the bias magnetic field and the transverse direction of the transducer in a horizontal plane was equal to 0°. The transverse direction of the transducer was perpendicular to the longitudinal direction thereof.

Parameters of the comparative sample of the magnetostatic wave device were measured as in Example 1. The results of the measurements are shown in FIG. 3.

Figure 3:
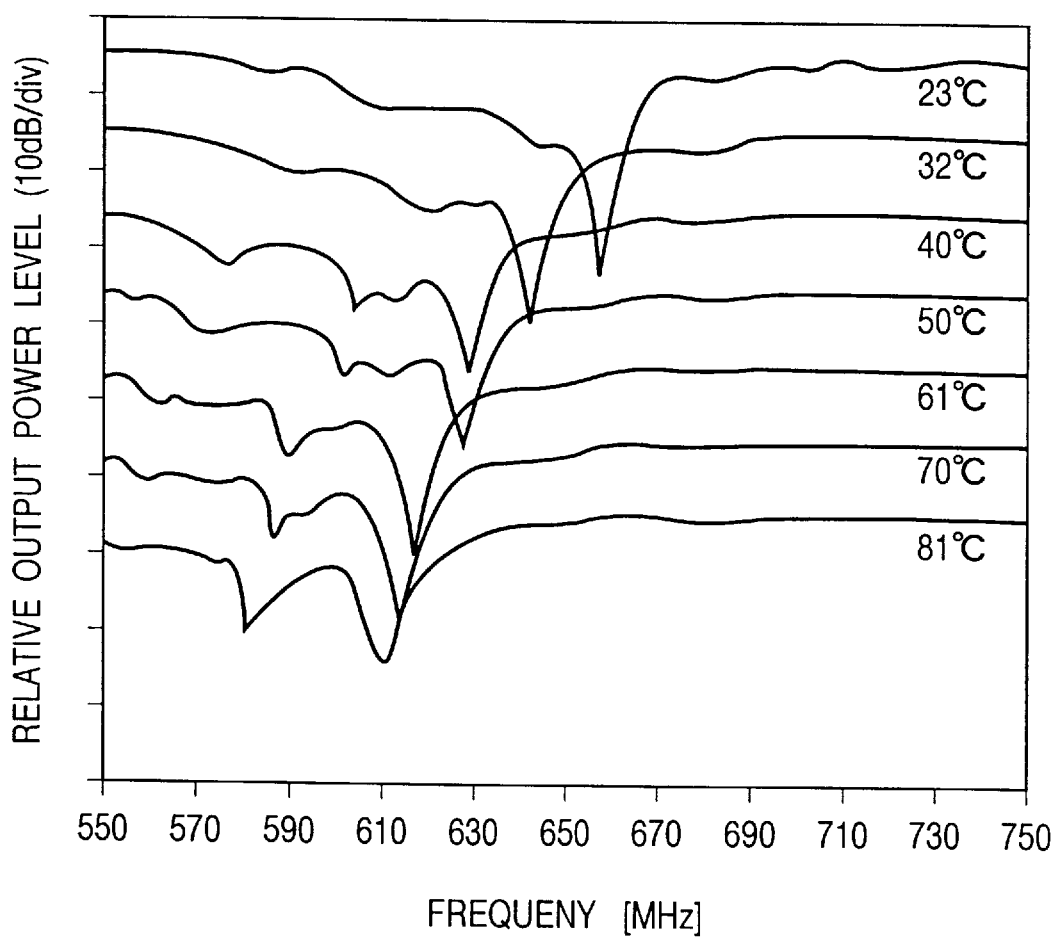
FIG. 3 is a diagram of the relation among the relative level of an output power (which corresponds to a reflection loss), the frequency of the output power, and an ambient temperature regarding a comparative sample.

As shown in FIG. 3, the center frequency of the reflection loss provided by the comparative sample of the magnetostatic wave device was equal to 655 MHz at a room temperature. When the temperature was changed from 23° to 81°, the width of the variation in the center frequency of the reflection loss was equal to 39.6 MHz. Thus, in the comparative sample of the magnetostatic wave device, the center frequency of the reflection loss had a considerable temperature dependency.

Comparative Example 2

A comparative sample of the magnetostatic wave device (for example, the microwave filter or the reflection-type S/N enhancer) was fabricated which was similar to that in Example 1 except that the angle $\theta_1$ between the longitudinal direction of the transducer and the <001> orientation of the crystal in the magnetic thin film was equal to 30°, and that the angle $\theta_2$ between the direction of the bias magnetic field and the transverse direction of the transducer in a horizontal plane was equal to 10°. The transverse direction of the transducer was perpendicular to the longitudinal direction thereof.

Parameters of the comparative sample of the magnetostatic wave device were measured as in Example 1. The center frequency of the reflection loss provided by the comparative sample of the magnetostatic wave device was equal to 554 MHz at a room temperature. When the temperature was changed from 28° to 80°, the width of the variation in the center frequency of the reflection loss was equal to 45.9 MHz. Thus, in the comparative sample of the magnetostatic wave device, the center frequency of the reflection loss had a considerable temperature dependency.

Conclusion

The measurement result parameters available in Examples 1–10 and Comparative Examples 1 and 2 are shown in FIG. 4. It was found from FIG. 4 that the width of the variation in the center frequency of the reflection loss in response to the temperature variation was equal to a remarkably small value or an acceptable value less than 15 MHz when the sum of the angles $\theta_1$ and $\theta_2$ was in the range of 20° to 35°. Also, it was found that the width of the variation in the center frequency of the reflection loss in response to the temperature variation was acceptably small when the sum of the angles $\theta_1$ and $\theta_2$ was in the range of −20° to −35°.

Accordingly, the magnetostatic wave device can effectively operate when the sum of the angles $\theta_1$ and $\theta_2$ is in the range of 20° to 35° or the range of −20° to −35°.

DESCRIPTION OF THE SECOND PREFERRED EMBODIMENT

Figure 5:
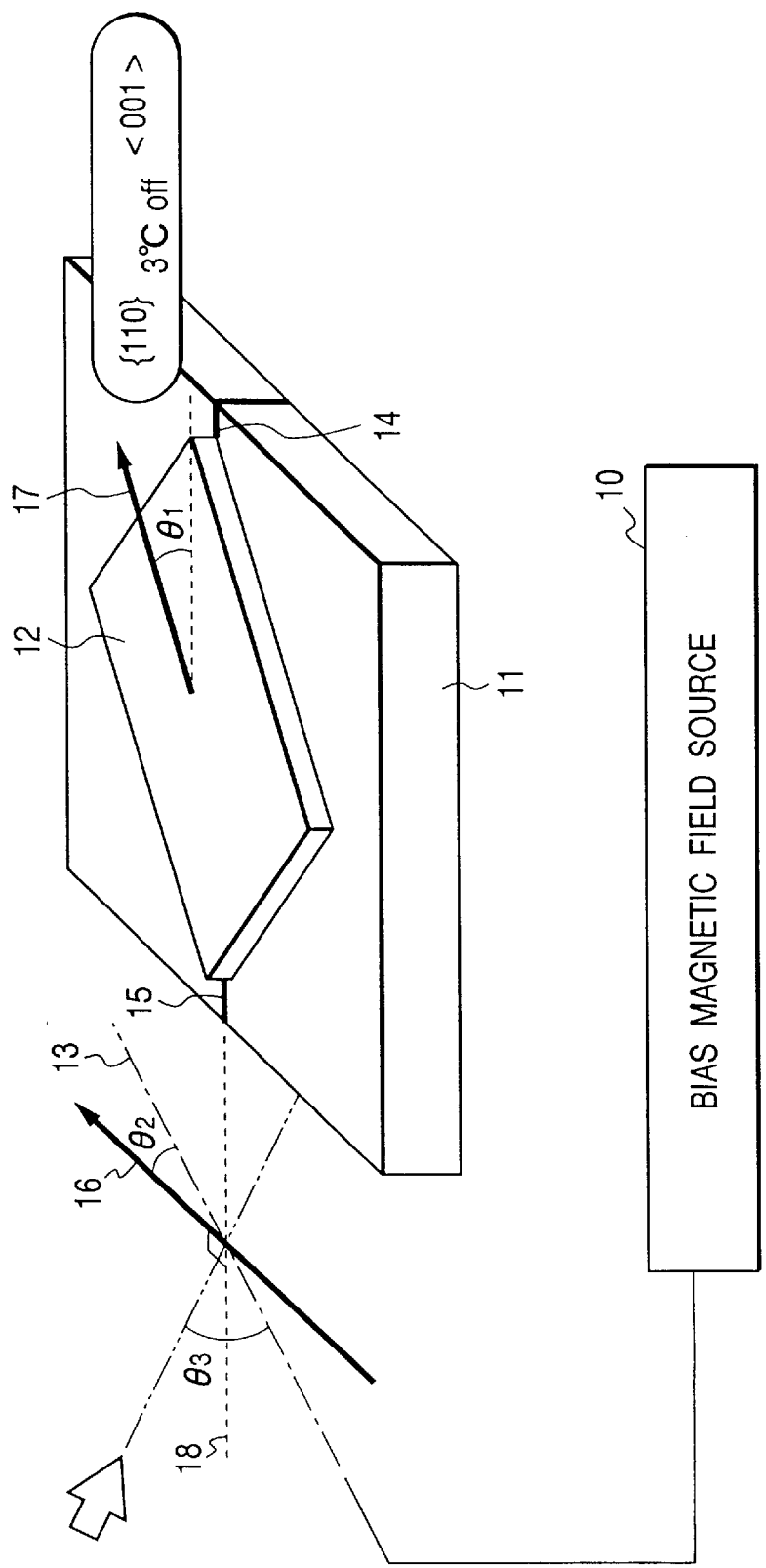
FIG. 5 is a diagram including a perspective view of a functional portion of a magnetostatic wave device according to a second embodiment of this invention.

With reference to FIG. 5, a magnetostatic wave device (for example, a microwave filter or a reflection-type S/N enhancer) includes a dielectric substrate 11 on which a magnetic thin film 12 of crystal (cubic crystal) of garnet is formed by, for example, liquid-phase epitaxy. A lower surface or a bottom surface of the dielectric substrate 11 is formed with a ground plane. The magnetic thin film 12 serves as a magnetostatic wave element. The magnetic thin film 12 is off-angled from or misoriented with respect to the {110} plane of the dielectric substrate 11 by a value in the range of 1° to 5°.

In FIG. 5, the numeral 13 denotes the direction of a bias magnetic field applied by a suitable device 10 referred to as a bias magnetic field source.

A transducer 14 provided on the dielectric substrate 11 connects with the magnetic thin film 12. The transducer 14 is used in exciting magnetostatic wave in response to an RF electric signal (RF electromagnetic wave). The transducer 14 is designed to provide acceptable impedance matching between electromagnetic wave and magnetostatic wave. Generally, the transducer 14 includes a strip line extending on the dielectric substrate 11. An input/output port 15 provided on the dielectric substrate 11 connects with the transducer 14.

In FIG. 5, the numeral 16 denotes a transverse direction of the transducer 14 which agrees with a direction of the propagation of magnetostatic wave. The transverse direction 16 is in a horizontal plane, and is perpendicular to the longitudinal direction 18 of the transducer 14. Here, the horizontal plane is defined as a plane parallel to an upper surface (a main or major surface) of the magnetic thin film 12 or the dielectric substrate 11. In addition, the numeral 17 denotes the <001> orientation of the crystal in the magnetic thin film 12. Furthermore, the character $\theta_1$ denotes the angle between the longitudinal direction 18 of the transducer 14 and the <001> orientation 17 of the magnetic thin film 12, and the character $\theta_2$ denotes the angle between the direction 13 of the bias magnetic field and the transverse direction 16 of the transducer 14 in a horizontal plane.

Positive values of the angles $\theta_1$ and $\theta_2$ are defined as being along clockwise directions while negative values of the angles $\theta_1$ and $\theta_2$ are defined as being along counterclockwise directions.

In FIG. 5, the character $\theta_3$ denotes the angle between a horizontal plane of the magnetic thin film 12 and the direction 13 of the bias magnetic field which occurs when the magnetic thin film 12 and the transducer 14 have been inclined and rotated about a rotation axis being the strip line of the transducer 14. Here, the upper surface (the main or major surface) of the magnetic thin film 12 is defined as the horizontal plane thereof.

A positive value of the angle $\theta_3$ is defined as being along a clockwise direction while a negative value of the angle $\theta_3$ is defined as being along a counterclockwise direction.

To attain a good temperature characteristic and a further lowered operating frequency of the magnetostatic wave device, it is preferable that the absolute value of the sum of the angles $\theta_1$ and $\theta_2$ is in the range of 20° to 35°, and that the absolute value of the angle $\theta_3$ is equal to or smaller than 75°. In other words, it is preferable that $20° \leq |\theta_1 + \theta_2| \leq 35°$, and $|\theta_3| \leq 75°$. When the angles $\theta_1$, $\theta_2$, and $\theta_3$ are outside the above-indicated ranges, it tends to be difficult to provide a good temperature characteristic and a further lowered operating frequency of the magnetostatic wave device.

The mode of the propagation of excited magnetostatic wave in the magnetostatic wave element (the magnetic thin film 12) of the magnetostatic wave device is one among a mode using only magnetostatic surface wave (MSSW), a mode using only magnetostatic backward volume wave (MSBVW), and a mode using a mixture of magnetostatic surface wave (MSSW) and magnetostatic backward volume wave (MSBVW).

The frequency "f" (MHz) of magnetostatic wave excited in the mode related to magnetostatic backward volume wave (MSBVW) is approximately given by the previously-indicated equation (1). The saturation magnetization "4πMs" of the magnetic thin film 12 and the anisotropic magnetic field Ha depend on an ambient temperature. Accordingly, the frequency "f" of excited magnetostatic wave depends on the ambient temperature in the case where a constant magnetic field is applied as the bias magnetic field H.

The anisotropic magnetic field Ha varies as a function of the crystal orientation, the saturation magnetization "4πMs", and the 1-order anisotropy constant $K_1$. The anisotropic magnetic field Ha is expressed by the previously-indicated equation (2). As previously explained, the character "θ" in the equation (2) denotes the angle between the <001> orientation and the direction of the bias magnetic field or an RF magnetic field in the {110} plane of the dielectric substrate 11. According to the equation (2), the anisotropic magnetic field Ha is nullified when the angle "θ" is equal to about ±30°. The sign of the anisotropic magnetic field Ha is inverted when the angle "θ" moves across one of the points equal to about ±30°. When the bias magnetic field "H" is equal to or weaker than several tens of gauss, temperature dependencies of first and second parenthesized terms in the square root in the equation (1) can be canceled by each other. Thus, in this case, the frequency "f" of excited magnetostatic wave can be constant and independent of a temperature variation.

Accordingly, the frequency "f" of excited magnetostatic wave can be stabilized against an ambient temperature variation by optimizing the direction of the bias magnetic field or the RF magnetic field in the case where the excited magnetic wave is in the mode being one among the mode using only magnetostatic surface wave (MSSW), the mode using only magnetostatic backward volume wave (MSBVW), and the mode using a mixture of magnetostatic surface wave (MSSW) and magnetostatic backward volume wave (MSBVW).

To determine conditions for stabilizing the frequency "f" against an ambient temperature variation by optimizing the direction of the bias magnetic field or the RF magnetic field, the relation between the frequency "f" and the ambient temperature variation was investigated at different values of the angles $\theta_1$, $\theta_2$, and $\theta_3$. As previously explained, the angle $\theta_1$ agrees with the angle between the longitudinal direction 18 of the transducer 14 and the <001> orientation 17 of the magnetic thin film 12, and the angle $\theta_2$ agrees with the angle between the direction 13 of the bias magnetic field and the transverse direction 16 of the transducer 14 in a horizontal plane. The transverse direction 16 of the transducer 14 is perpendicular to the longitudinal direction 18 thereof. In addition, the angle $\theta_3$ agrees with the angle between the horizontal plane of the magnetic thin film 12 and the direction 13 of the bias magnetic field which occurs when the magnetic thin film 12 and the transducer 14 have been inclined and rotated about a rotation axis being the strip line of the transducer 14.

It was found from the result of the investigation that the width of the variation in the center frequency of a reflection loss of the magnetostatic wave device (which corresponds to the width of the variation in the frequency "f") in response to the ambient temperature variation agreed with a remarkably small value or an acceptable value equal to less than 15 MHz when the sum of the angles $\theta_1$ and $\theta_2$ was in the range of 20° to 35°. The garnet crystal in the magnetic thin film 12 was cubic, and was hence symmetrical with respect to the <001> orientation 17. Accordingly, it was also found that the width of the variation in the center frequency of a reflection loss of the magnetostatic wave device in response to the ambient temperature variation was acceptably small when the sum of the angles $\theta_1$ and $\theta_2$ was in the range of −20° to −35°. On the other hand, the width of the variation in the center frequency of a reflection loss of the magnetostatic wave device in response to the ambient temperature variation was unacceptable when the sum of the angles $\theta_1$ and $\theta_2$ was outside the range of 20° to 35° or the range of −20° to −35°. Also, it was found from the result of the investigation that the excitation of magnetostatic wave succeeded when the absolute value of the angle $\theta_3$ was equal to or smaller than 75°. On the other hand, magnetostatic wave was not sufficiently excited when the absolute value of the angle $\theta_3$ was greater than 75°.

To attain a good temperature characteristic and a further lowered operating frequency of the magnetostatic wave device, it is preferable that the sum of the angles $\theta_1$ and $\theta_2$ is in the range of 20° to 35° or the range of −20° to −35°, and that the absolute value of the angle $\theta_3$ is equal to or smaller than 75°.

T. Hibiya has reported that during liquid-phase epitaxy on a {110} garnet substrate, crystal tends to abnormally grow, and that a thick film of the crystal is hardly available in this case (T. Hibiya, J. Crystal Growth, 62, p. 87 (1983)). Also, T. Hibiya has reported that use of an off-angled substrate slightly inclined with respect to the {110} plane enables the formation of a thick film.

Experiments were carried out as follows. During the experiments, magnetic thin films of crystal were grown on {110} off-angled or misoriented substrates by liquid-phase epitaxy. Transducers for exciting magnetostatic wave were provided on the {110} off-angled substrates. Thereby, various samples of a magnetostatic wave device were fabricated. There were various relations between the crystal orientations and the transducer orientations. Regarding each of the samples, a measurement was made as to a variation of the frequency of excited magnetostatic wave in response to an ambient temperature variation under conditions where a constant bias magnetic field was applied and the direction of the applied magnetic field was changed, and the excited magnetostatic wave was in one among the mode using only magnetostatic surface wave (MSSSW), the mode using only magnetostatic backward volume wave (MSBVW), and the mode using a mixture of magnetostatic surface wave (MSSW) and magnetostatic backward volume wave (MSBVW). Thus, a variation of the frequency of excited magnetostatic wave in response to an ambient temperature variation was measured while the relation between the crystal orientation and the transducer orientation was changed among various types and also the direction of the applied magnetic field was changed among various values. It was found from the results of the measurements that the excitation frequency of magnetostatic wave was substantially unchanged in response to an ambient temperature variation in the case of specified conditions of the crystal orientation, the transducer orientation, and the applied magnetic field direction.

It is preferable that the magnetic thin film 12 of garnet, that is, the magnetostatic wave element, is formed by liquid-phase epitaxy on a $Gd_3Ga_5O_{12}$ substrate which is off-angled from or misoriented with respect to the {110} plane by a value in the range of 1° to 5°. When the off-angle is smaller than 1°, crystal tends to abnormally grow so that a thick film of the crystal is hardly available. When the off-angle exceeds 5°, the FMR (ferromagnetic resonance) linewidth ΔH of the magnetic thin film 12 tends to be unacceptably great.

EXAMPLE 11

A sample of the magnetostatic wave device (for example, the microwave filter or the reflection-type S/N enhancer) was fabricated as follows. A $Gd_3Ga_5O_{12}$ substrate was prepared which was off-angled from the {110} plane by 3°. A magnetic thin film of YIG crystal having composition "$La_{0.12}Y_{2.88}Fe_{4.46}Ga_{0.54}O_{12}$" was grown on the $Gd_3Ga_5O_{12}$ substrate by liquid-phase epitaxy. The magnetic thin film had a thickness of 59 μm. The magnetic thin film exhibited a saturation magnetization "4πMs" of 920 G at a room temperature. Regarding the magnetic thin film, the half-value width (the FMR linewidth) ΔH was equal to 1.3 Oe.

The magnetic thin film was cut and shaped into a rectangular or square chip in a manner such that a pair of opposite side surfaces of the chip extended in directions parallel to the <001> orientation. The chip had a size of, for example, 12 mm by 12 mm. A sample of the magnetostatic wave device was completed which used the magnetic thin film chip. The sample of the magnetostatic wave device had the structure of FIG. 5.

In the sample of the magnetostatic wave device, the angle $\theta_1$ between the longitudinal direction of the transducer and the <001> orientation of the crystal in the magnetic thin film was equal to 20°. The angle $\theta_2$ between the direction of the bias magnetic field and the transverse direction of the transducer in a horizontal plane was equal to 0°. The transverse direction of the transducer is perpendicular to the longitudinal direction thereof. As previously explained, the angle $\theta_3$ agrees with the angle between the horizontal plane of the magnetic thin film and the direction of the bias magnetic field which occurs when the magnetic thin film and the transducer have been inclined and rotated about a rotation axis being the strip line of the transducer.

The sample of the magnetostatic wave device causes a reflection loss when magnetostatic wave was excited in the magnetic thin film. Regarding the sample of the magnetostatic wave device, measurements were made as to the center frequency of the reflection loss and variations in the center frequency while a magnetic field having a constant strength was applied as a bias magnetic field and an ambient temperature was changed from a room temperature level to about 80°, and also the angle $\theta_3$ was changed among various values. During the measurements, the temperature change and the applied magnetic field were adjusted so that the width of each center frequency variation was limited to 15 MHz or smaller. The results of the measurements are shown in FIG. 6.

With reference to FIG. 6, the center frequency of the reflection loss which related to a good temperature characteristic dropped as the angle $\theta_3$ was changed from 0° in a clockwise direction or a counterclockwise direction. The center frequency of the reflection loss was minimized when the angle $\theta_3$ reached about ±65°. Specifically, the center frequency of the reflection loss was equal to 455 MHz when the angle $\theta_3$ was equal to −65°. On the other hand, the center frequency of the reflection loss was equal to 604 MHz when the angle $\theta_3$ was equal to 0°. Thus, the center frequency of the reflection loss at an angle $\theta_3$ of −65° was lower than that at an angle $\theta_3$ of 0° by about 50 MHz. The center frequency of the reflection loss rose as the angle $\theta_3$ was changed from about ±65° toward +90° or −90° in the clockwise direction or the counterclockwise direction. The center frequency of the reflection loss at an angle $\theta_3$ of ±75° was comparable to that at an angle $\theta_3$ of 0°. Magnetostatic wave was not excited when the absolute value of the angle $\theta_3$ was equal to or greater than 82°.

EXAMPLE 12

A sample of the magnetostatic wave device (for example, the microwave filter or the reflection-type S/N enhancer) was fabricated which was similar to that in Example 11 except that the angle $\theta_1$ between the longitudinal direction of the transducer and the <001> orientation of the crystal in the magnetic thin film was equal to 20°, and that the angle $\theta_2$ between the direction of the bias magnetic field and the transverse direction of the transducer in a horizontal plane was equal to 10°. The transverse direction of the transducer was perpendicular to the longitudinal direction thereof.

Parameters of the sample of the magnetostatic wave device were measured as in Example 11. According to the measurement results, the center frequency of the reflection loss which related to a good temperature characteristic dropped as the angle $\theta_3$ was changed from 0° in a clockwise direction or a counterclockwise direction. The center frequency of the reflection loss was minimized when the angle $\theta_3$ reached about ±65°. Specifically, the center frequency of the reflection loss was equal to 432 MHz when the angle $\theta_3$ was equal to −65°. The center frequency of the reflection loss at an angle $\theta_3$ of −65° was lower than that at an angle $\theta_3$ of 0° by about 80 MHz. The center frequency of the reflection loss rose as the angle $\theta_3$ was changed from about ±65° toward +90° or −90° in the clockwise direction or the counterclockwise direction. The center frequency of the reflection loss at an angle $\theta_3$ of ±75° was comparable to that at an angle $\theta_3$ of 0°. Magnetostatic wave was not excited when the absolute value of the angle $\theta_3$ was equal to or greater than 82°.

EXAMPLE 13

A sample of the magnetostatic wave device (for example, the microwave filter or the reflection-type S/N enhancer) was fabricated which was similar to that in Example 11 except that the angle $\theta_1$ between the longitudinal direction of the transducer and the <001> orientation of the crystal in the magnetic thin film was equal to 0°, and that the angle $\theta_2$ between the direction of the bias magnetic field and the transverse direction of the transducer in a horizontal plane was equal to 20°. The transverse direction of the transducer was perpendicular to the longitudinal direction thereof.

Parameters of the sample of the magnetostatic wave device were measured as in Example 11. According to the measurement results, the center frequency of the reflection loss which related to a good temperature characteristic dropped as the angle $\theta_3$ was changed from 0° in a clockwise direction or a counterclockwise direction. The center frequency of the reflection loss was minimized when the angle $\theta_3$ reached about ±65°. The center frequency of the reflection loss at an angle $\theta_3$ of −65° was lower than that at an angle $\theta_3$ of 0° by about 52 MHz. The center frequency of the reflection loss rose as the angle $\theta_3$ was changed from about ±65° toward +90° or −90° in the clockwise direction or the counterclockwise direction. The center frequency of the reflection loss at an angle $\theta_3$ of ±75° was comparable to that at an angle $\theta_3$ of 0°. Magnetostatic wave was not excited when the absolute value of the angle $\theta_3$ was equal to or greater than 82°.

EXAMPLE 14

A sample of the magnetostatic wave device (for example, the microwave filter or the reflection-type S/N enhancer) was fabricated which was similar to that in Example 11 except that the angle $\theta_1$ between the longitudinal direction of the transducer and the <001> orientation of the crystal in the magnetic thin film was equal to 15°, and that the angle $\theta_2$ between the direction of the bias magnetic field and the transverse direction of the transducer in a horizontal plane was equal to 10°. The transverse direction of the transducer was perpendicular to the longitudinal direction thereof.

Parameters of the sample of the magnetostatic wave device were measured as in Example 11. According to the measurement results, the center frequency of the reflection loss which related to a good temperature characteristic dropped as the angle $\theta_3$ was changed from 0° in a clockwise direction or a counterclockwise direction. The center frequency of the reflection loss was minimized when the angle $\theta_3$ reached about ±65°. The center frequency of the reflection loss at an angle $\theta_3$ of −65° was lower than that at an angle $\theta_3$ of 0° by about 51 MHz. The center frequency of the reflection loss rose as the angle $\theta_3$ was changed from about ±65° toward +90° or −90° in the clockwise direction or the counterclockwise direction. The center frequency of the reflection loss at an angle $\theta_3$ of ±75° was comparable to that at an angle $\theta_3$ of 0°. Magnetostatic wave was not excited when the absolute value of the angle $\theta_3$ was equal to or greater than 82°.

EXAMPLE 15

A sample of the magnetostatic wave device (for example, the microwave filter or the reflection-type S/N enhancer) was fabricated which was similar to that in Example 11 except that the angle $\theta_1$ between the longitudinal direction of the transducer and the <001> orientation of the crystal in the magnetic thin film was equal to 30°, and that the angle $\theta_2$ between the direction of the bias magnetic field and the transverse direction of the transducer in a horizontal plane was equal to 5°. The transverse direction of the transducer was perpendicular to the longitudinal direction thereof.

Parameters of the sample of the magnetostatic wave device were measured as in Example 11. According to the measurement results, the center frequency of the reflection loss which related to a good temperature characteristic dropped as the angle $\theta_3$ was changed from 0° in a clockwise direction or a counterclockwise direction. The center frequency of the reflection loss was minimized when the angle $\theta_3$ reached about ±65°. The center frequency of the reflection loss at an angle $\theta_3$ of −65° was lower than that at an angle $\theta_3$ of 0° by about 101 MHz. The center frequency of the reflection loss rose as the angle $\theta_3$ was changed from about ±65° toward +90° or −90° in the clockwise direction or the counterclockwise direction. The center frequency of the reflection loss at an angle $\theta_3$ of ±75° was comparable to that at an angle $\theta_3$ of 0°. Magnetostatic wave was not excited when the absolute value of the angle $\theta_3$ was equal to or greater than 82°.

Conclusion

It was found from the measurement results regarding Examples 11–15 that the center frequency of the reflection loss provided by the magnetostatic wave device was relatively low when the angle $\theta_3$ was in the range of 0° to about +75° or the range of 0° to about −75°. Also, it was found that the center frequency of the reflection loss at an angle $\theta_3$ of −65° was lower than that at an angle $\theta_3$ of 0° by greater than 50 MHz. Thus, it is preferable that the angle $\theta_3$ is in the range of 0° to about +75° or the range of 0° to about −75°. It is more preferable that the angle $\theta_3$ is in the range of 20° to about +65° or the range of −20° to about −65°.

What is claimed is:

1. A magnetostatic wave device comprising:
   a $Gd_3Ga_5O_{12}$ substrate off-angled from a {110} plane;
   a magnetic thin film including a crystal of garnet and being formed on the $Gd_3Ga_5O_{12}$ substrate by liquid-phase epitaxy;
   a transducer for exciting magnetostatic wave in the magnetic thin film in response to an RF electric signal; and
   means for applying a bias magnetic field to the magnetic thin film;
   wherein there is a relation as $20° \leq |\theta_1 + \theta_2| \leq 35°$, where "$\theta_1$" denotes an angle between a longitudinal direction of the transducer and a <001> orientation of the crystal in the magnetic thin film, and "$\theta_2$" denotes an angle between a direction of the bias magnetic field and a transverse direction of the transducer which is perpendicular to the longitudinal direction thereof.

2. A magnetostatic wave device as recited in claim 1, wherein the $Gd_3Ga_5O_{12}$ substrate is off-angled from the {110} plane by an angle in a range of 1° to 5°.

3. A magnetostatic wave device comprising:

a $Gd_3Ga_5O_{12}$ substrate off-angled from a {110} plane;

a magnetic thin film including a crystal of garnet and being formed on the $Gd_3Ga_5O_{12}$ substrate by liquid-phase epitaxy;

a transducer for exciting magnetostatic wave in the magnetic thin film in response to an RF electric signal, the transducer including a strip line; and means for applying a bias magnetic field to the magnetic thin film;

wherein there is a relation as $20° \leq |\theta_1 + \theta_2| \leq 35°$, where "$\theta_1$" denotes an angle between a longitudinal direction of the transducer and a <001> orientation of the crystal in the magnetic thin film, and "$\theta_2$" denotes an angle between a direction of the bias magnetic field and a transverse direction of the transducer which is perpendicular to the longitudinal direction thereof; and wherein there is a relation as $|\theta_3| \leq 75°$, where "$\theta_3$" denotes an angle between a horizontal plane of the magnetic thin film and the direction of the bias magnetic field which occurs under conditions where the magnetic thin film and the transducer have been inclined and rotated about a rotation axis being the strip line of the transducer.

4. A magnetostatic wave device as recited in claim 3, wherein the $Gd_3Ga_5O_{12}$ substrate is off-angled from the {110} plane by an angle in a range of 1° to 5°.

* * * * *